United States Patent
Liao et al.

(10) Patent No.: US 10,163,642 B2
(45) Date of Patent: Dec. 25, 2018

(54) SEMICONDUCTOR DEVICE, METHOD AND TOOL OF MANUFACTURE

(71) Applicant: Taiwan Semiconductor Manufacturing Company, Ltd., Hsin-Chu (TW)

(72) Inventors: Chih-Teng Liao, Hsin-Chu (TW); Tzu-Chan Weng, Kaohsiung (TW); Yi-Wei Chiu, Kaohsiung (TW); Chen Yung-Chan, Tainan (TW); Chia-Tsung Tso, Hsin-Chu (TW); Yu-Li Lin, Kaohsiung (TW); Chun-Hung Liu, New Taipei (TW); Kun-Cheng Chen, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/284,162

(22) Filed: Oct. 3, 2016

(65) Prior Publication Data

US 2018/0005832 A1    Jan. 4, 2018

Related U.S. Application Data

(60) Provisional application No. 62/357,140, filed on Jun. 30, 2016.

(51) Int. Cl.
*H01L 21/283*    (2006.01)
*H01L 29/66*    (2006.01)
*H01L 21/3065*    (2006.01)
*H01L 21/67*    (2006.01)
*H01L 21/683*    (2006.01)

(52) U.S. Cl.
CPC ........ *H01L 21/283* (2013.01); *H01L 21/3065* (2013.01); *H01L 21/67011* (2013.01); *H01L 21/67063* (2013.01); *H01L 21/6833* (2013.01); *H01L 29/66795* (2013.01)

(58) Field of Classification Search
CPC ............... H01L 21/283; H01L 21/3065; H01L 21/67011; H01L 21/67063; H01L 21/6833; H01L 29/66795; H01L 21/76898; H01J 37/32642; H01J 37/321
See application file for complete search history.

(56) References Cited

U.S. PATENT DOCUMENTS

| | | | | |
|---|---|---|---|---|
| 5,900,064 A | * | 5/1999 | Kholodenko | C23C 16/4585 118/723 E |
| 6,108,189 A | * | 8/2000 | Weldon | C23C 16/4586 279/128 |
| 6,284,093 B1 | * | 9/2001 | Ke | H01J 37/32623 156/345.51 |
| 6,344,105 B1 | * | 2/2002 | Daugherty | H01J 37/32623 156/345.51 |

(Continued)

*Primary Examiner* — Savitr Mulpuri
(74) *Attorney, Agent, or Firm* — Slater Matsil, LLP

(57) ABSTRACT

A semiconductor manufacturing tool and process to form semiconductor devices is provided. An edge ring of the semiconductor manufacturing tool comprises a high electron mobility material in order to extend an electrical field and sheath such that curvature from the sheath is moved away from a semiconductor wafer so that an impact from the curvature is reduced or eliminated during an etching process.

17 Claims, 10 Drawing Sheets

(56) References Cited

U.S. PATENT DOCUMENTS

| | | | | |
|---|---|---|---|---|
| 6,391,787 B1* | 5/2002 | Dhindsa | ............ | H01J 37/32009 118/723 R |
| 7,758,764 B2* | 7/2010 | Dhindsa | ............ | H01J 37/32091 118/723 MP |
| 7,837,827 B2* | 11/2010 | Dhindsa | ............ | H01J 37/32091 156/345.51 |
| 8,342,121 B2* | 1/2013 | Koshimizu | ....... | H01J 37/32091 118/723 E |
| 8,500,953 B2* | 8/2013 | Chang | ............... | H01J 37/32623 156/345.43 |
| 9,017,526 B2* | 4/2015 | Singh | ................ | H01J 37/32422 156/345.1 |
| 9,137,884 B2* | 9/2015 | Vinogradov | .......... | H01J 37/321 |
| 9,337,003 B2* | 5/2016 | Murakami | ........ | H01J 37/32477 |
| 9,385,219 B2* | 7/2016 | Yieh | ................ | H01L 29/66803 |
| 9,406,535 B2* | 8/2016 | Berry, III | .......... | H01L 21/67069 |
| 9,515,166 B2* | 12/2016 | Nemani | ............... | H01L 21/0228 |
| 9,852,889 B1* | 12/2017 | Kellogg | ............ | H01J 37/32091 |
| 2004/0092128 A1 | 5/2004 | Grant et al. | | |
| 2007/0032081 A1* | 2/2007 | Chang | ............... | H01J 37/32623 438/689 |
| 2008/0020574 A1* | 1/2008 | Marakhtanov | .... | H01J 37/32091 438/689 |
| 2008/0170842 A1* | 7/2008 | Hunter | ............... | H01L 21/67115 392/416 |
| 2011/0011534 A1* | 1/2011 | Dhindsa | ............ | H01J 37/32091 156/345.43 |
| 2011/0126984 A1* | 6/2011 | Kang | ................ | H01J 37/32091 156/345.51 |
| 2012/0322270 A1* | 12/2012 | Long | ..................... | H01J 37/321 438/710 |
| 2014/0110785 A1 | 4/2014 | Jagannathan et al. | | |
| 2014/0235063 A1* | 8/2014 | McMillin | .......... | H01J 37/32009 438/716 |
| 2016/0300725 A1 | 10/2016 | Ambati et al. | | |

* cited by examiner

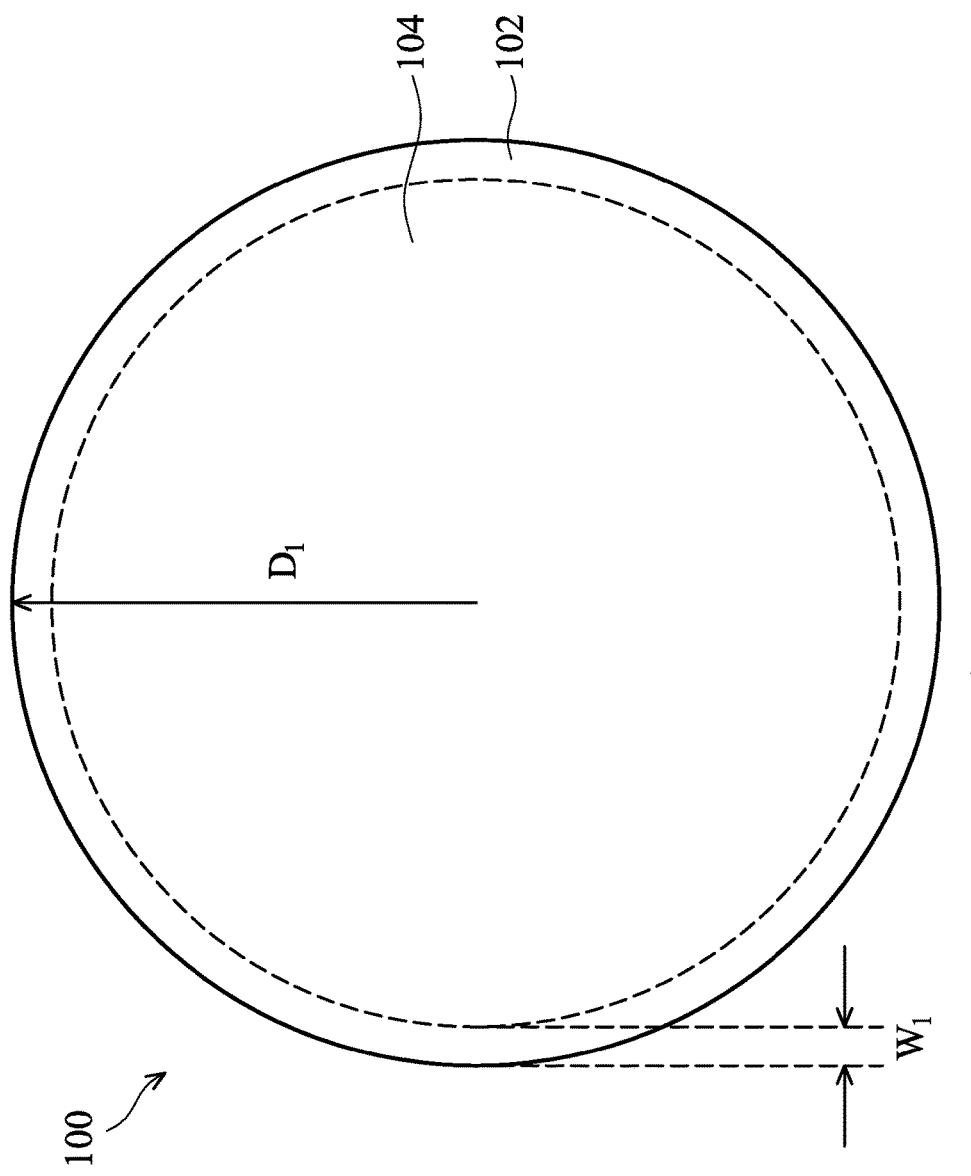

SEMICONDUCTOR DEVICE, METHOD AND TOOL OF MANUFACTURE

PRIORITY CLAIM

This application claims the benefit of U.S. Provisional Application No. 62/357,140, filed on Jun. 30, 2016 and entitled "Semiconductor Device, Method and Tool of Manufacture," which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1B illustrates a semiconductor wafer with fins and a gate electrode material in accordance with some embodiments.

DETAILED DESCRIPTION

Figure 1B:
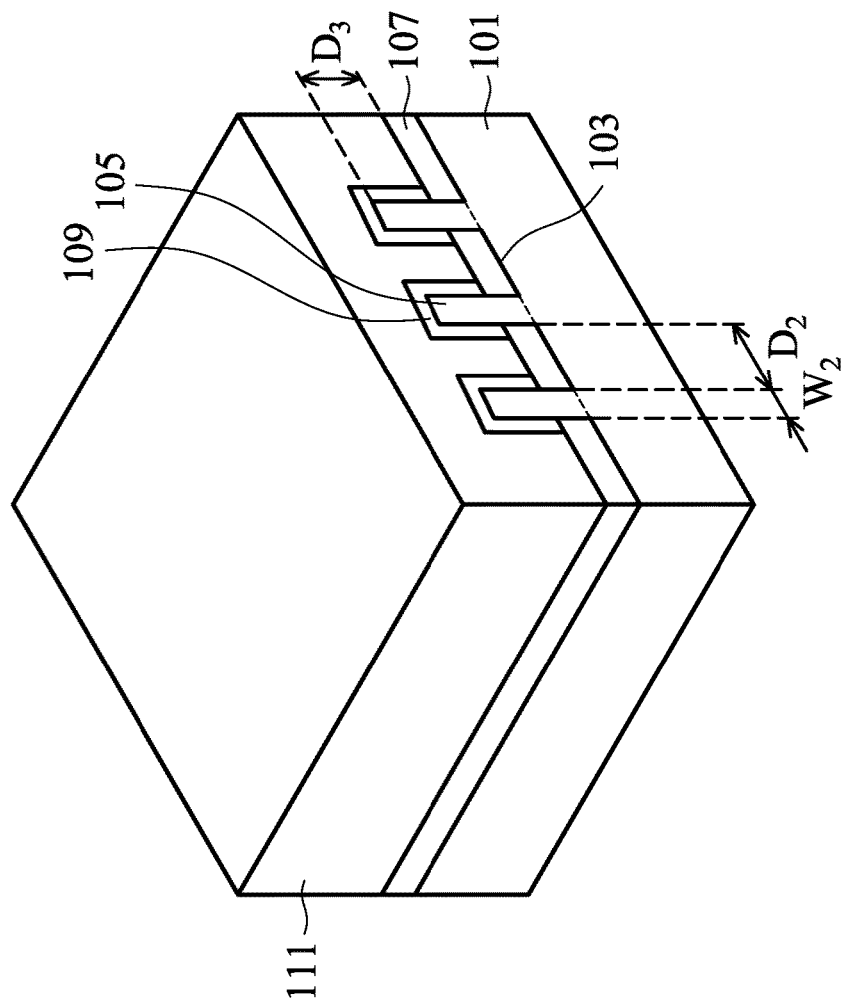

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1A, there is illustrated a top-down view of a semiconductor wafer 100 that has been covered with a gate electrode material 111. In an embodiment the semiconductor wafer 100 may be viewed as having a central region 104 and an edge region 102. These regions are indicated as being separate from each other in FIG. 1A by the dashed circle, although no such circle is readily apparent in the actual product.

In an embodiment the edge region 102 of the semiconductor wafer 100 may be a region that is potentially affected by a curvature of an electrical field and sheath during, e.g., an etching process (described further below with respect to FIGS. 3A-3B). For example, in an embodiment in which the semiconductor wafer 100 as a whole has a diameter that is a first distance $D_1$ of between about 149 mm to about 300 mm, such as about 150 mm, the edge region 102 may have a first width $W_1$ of between about 20 mm and about 25 mm, such as about 24 mm.

FIG. 1B illustrates a close up view of structures on and in the semiconductor wafer 100, and the structures formed as illustrated in FIG. 1B are located within the edge region 102 of the semiconductor wafer 100 illustrated in FIG. 1A. As illustrated in FIG. 1B, there is shown a substrate 101 with first trenches 103 formed therein. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 107. The first trenches 103 may be formed using a masking layer (not separately illustrated in FIG. 1B) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 are formed may be utilized. Any suitable process, including any number of masking and removal steps may be used.

In addition to forming the first trenches 103, the masking and etching process additionally forms fins 105 from those portions of the substrate 101 that remain unremoved. For convenience the fins 105 have been illustrated in the figures as being separated from the substrate 101 by a dashed line, although a physical indication may or may not be present. These fins 105 may be used, as discussed below, to form the channel region of multiple-gate FinFET transistors. While FIG. 1A only illustrates three fins 105 formed from the substrate 101, any number of fins 105 may be utilized.

The fins 105 may be formed such that they have a second width $W_2$ at the surface of the substrate 101 of between about 5 nm and about 80 nm, such as between about 20 nm to about 23 nm, or about 30 nm. Additionally, the fins 105 may be spaced apart from each other by a second distance $D_2$ of between about 21 nm and about 26 nm. By spacing the fins 105 in such a fashion, the fins 105 may each form a separate channel region while still being close enough to share a common gate (discussed further below).

Once the first trenches 103 and the fins 105 have been formed, the first trenches 103 may be filled with a dielectric material and the dielectric material may be recessed within the first trenches 103 to form the first isolation regions 107. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 105 through a suitable process such as chemical mechanical polishing (CMP), an etch, a combination of these, or the like. In an embodiment, the removal process removes any dielectric material that is located over the fins 105 as well, so that the removal of the dielectric material will expose the surface of the fins 105 to further processing steps.

Once the first trenches 103 have been filled with the dielectric material, the dielectric material may then be recessed away from the surface of the fins 105. The recessing may be performed to expose at least a portion of the sidewalls of the fins 105 adjacent to the top surface of the fins 105. The dielectric material may be recessed using a wet etch by dipping the top surface of the fins 105 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a third distance $D_3$ from the surface of the fins 105 of between about 40 Å and about 500 Å, such as about 42 Å. Additionally, the recessing may also remove any leftover dielectric material located over the fins 105 to ensure that the fins 105 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 107 have been formed, a gate dielectric material 109 and a gate electrode material 111 may be formed over each of the fins 105. In an embodiment the gate dielectric material 109 may be formed by thermal oxidation, chemical vapor deposition, sputtering, or any other suitable method. Depending on the technique of gate dielectric formation, the gate dielectric material 109 thickness on the top of the fins 105 may be different from the gate dielectric thickness on the sidewall of the fins 105.

The gate dielectric material 109 may comprise a material such as silicon dioxide or silicon oxynitride with a thickness ranging from about 3 angstroms to about 100 angstroms, such as about 10 angstroms. The gate dielectric material 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the gate dielectric material 109.

The gate electrode material 111 may comprise a conductive material and may be selected from a group comprising of polycrystalline-silicon (poly-Si), poly-crystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc.

The gate electrode material 111 may be deposited by chemical vapor deposition (CVD), sputter deposition, or other suitable techniques for depositing conductive materials. The thickness of the gate electrode material 111 may be in the range of about 150 nm to about 180 nm, such as about 160 nm. The top surface of the gate electrode material 111 may have a non-planar top surface, and may be planarized prior to patterning of the gate electrode material 111 or gate etch. Ions may or may not be introduced into the gate electrode material 111 at this point. Ions may be introduced, for example, by ion implantation techniques.

Figure 2A:
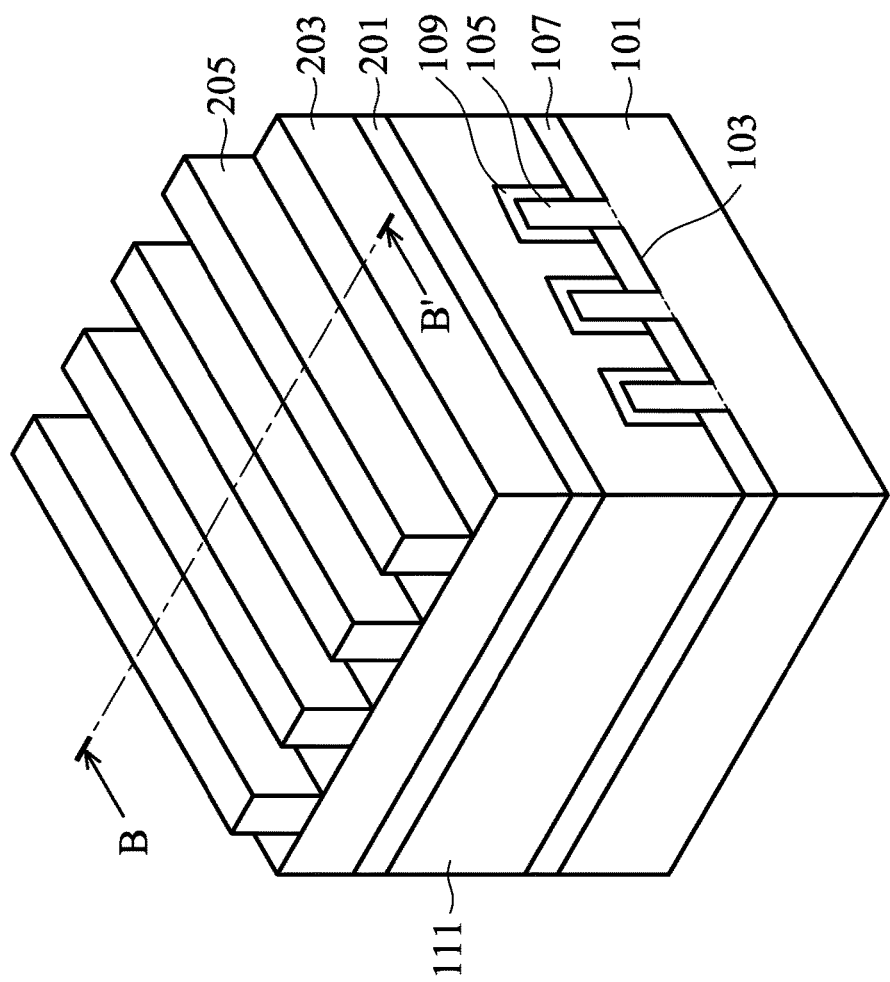
FIGS. 2A-2B illustrate a formation of hardmasks and a photoresist in accordance with some embodiments.
Figure 2B:
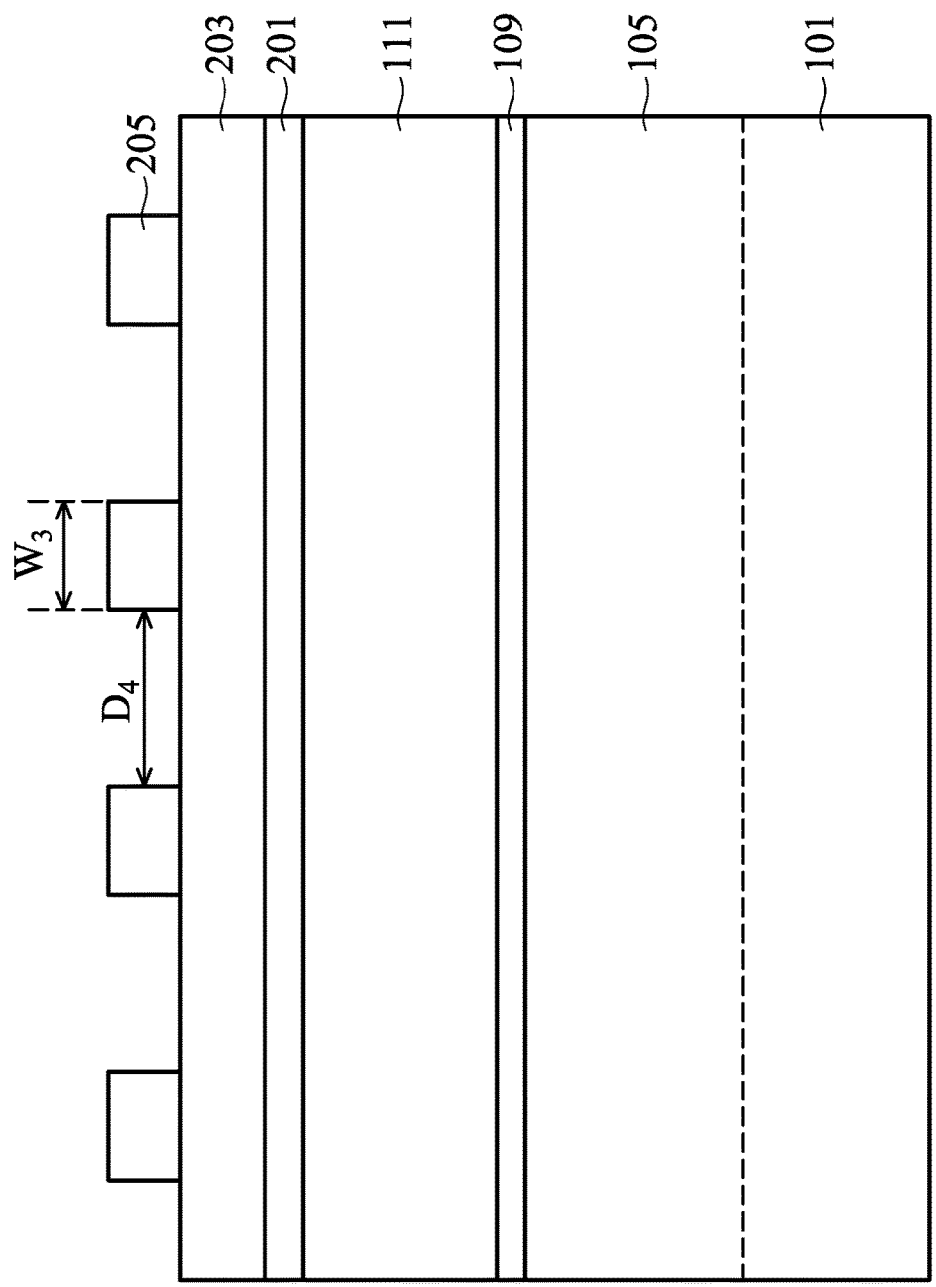

FIGS. 2A-2B, with FIG. 2B being a cross-sectional view of FIG. 2A along line B-B', illustrates that once formed, the gate dielectric material 109 and the gate electrode material 111 may be patterned to form a series of gate stacks 415 over the fins 105. The gate stacks 415, once patterned, will form multiple channel regions located on each side of the fins 105 beneath the gate dielectric material 109. In an embodiment the patterning of the gate stacks 415 may be initiated by depositing a first hardmask 201 and a second hardmask 203 over the gate electrode material 111. In an embodiment the first hardmask 201 may be a material such as silicon oxide formed through a deposition process such as chemical vapor deposition or physical vapor deposition, or may be formed through a thermal oxidation process. The first hardmask 201 may be formed to have a thickness of between about 8 nm and about 12 nm, such as about 10 nm. However, any suitable material, process of formation, and thickness may be utilized.

Once the first hardmask 201 has been formed, the second hardmask 203 is formed over the first hardmask 201. In an embodiment the second hardmask 203 comprises a dielectric material such as silicon nitride, titanium nitride, silicon oxynitride, combinations of these, or the like. The second hardmask 203 may be formed using a process such as chemical vapor deposition, plasma enhanced chemical vapor deposition, atomic layer deposition, or the like. However, any other suitable material and method of formation may be utilized. The second hardmask 203 may be formed to a thickness of between about 700 Å and about 870 Å, such as about 770 Å, so that the first hardmask 201 and the second hardmask 203 have a combined total height of between about 78 nm and about 99 nm, such as about 87 nm. However, any suitable thicknesses may be utilized.

FIGS. 2A-2B also illustrate a placement and patterning of a first photoresist 205 over the second hardmask 203. In an embodiment the first photoresist 205 is a tri-layer photoresist, with a bottom anti-reflective coating (BARC) layer, an intermediate mask layer, and a top photoresist layer (not separately illustrated within FIGS. 2A-2B). However, any suitable type of photosensitive material or combination of materials may be utilized.

Once the first photoresist 205 has been placed over the second hardmask 203, the first photoresist 205 is patterned. In an embodiment the first photoresist 205 may be patterned by exposing a photosensitive material within the first photoresist 205 (e.g., the top photoresist layer in the tri-layer photoresist) to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the first photoresist 205 are different from the physical properties of the unexposed portions of the first photoresist 205. The first photoresist 205 may then be developed with, e.g., a developer (not separately illustrated), in order to separate the exposed portion of the first photoresist 205 from the unexposed portion of the first photoresist 205.

Additionally, while the placement of the first photoresist 205 has been described above, embodiments are not intended to be limited to using the first photoresist 205. Rather, any suitable patterning process may be utilized, such as by placing the first photoresist 205 and patterning the first photoresist 205 into mandrels. Spacers (not separately illustrated) may then be formed on opposing sides of the mandrels, and the mandrels may be removed, leaving behind the spacers, which may be used in place of the first photoresist 205. Any suitable process may be utilized to form the mask, and all such processes are fully intended to be included within the scope of the embodiments.

In an embodiment the first photoresist 205 may be patterned such that the first photoresist 205 can be used to form gate stacks 415 (not illustrated in FIGS. 2A-2B but illustrated and described below with respect to FIG. 4). As such, the first photoresist 205 may be formed to have a third width $W_3$ of between about 20 nm and about 24 nm, such as about 22 nm. Additionally, separate portions of the first photoresist 205 may be formed to be separated by a fourth distance $D_4$ of between about 42 nm and about 47 nm. However, any suitable dimensions may be utilized.

Figure 3A:
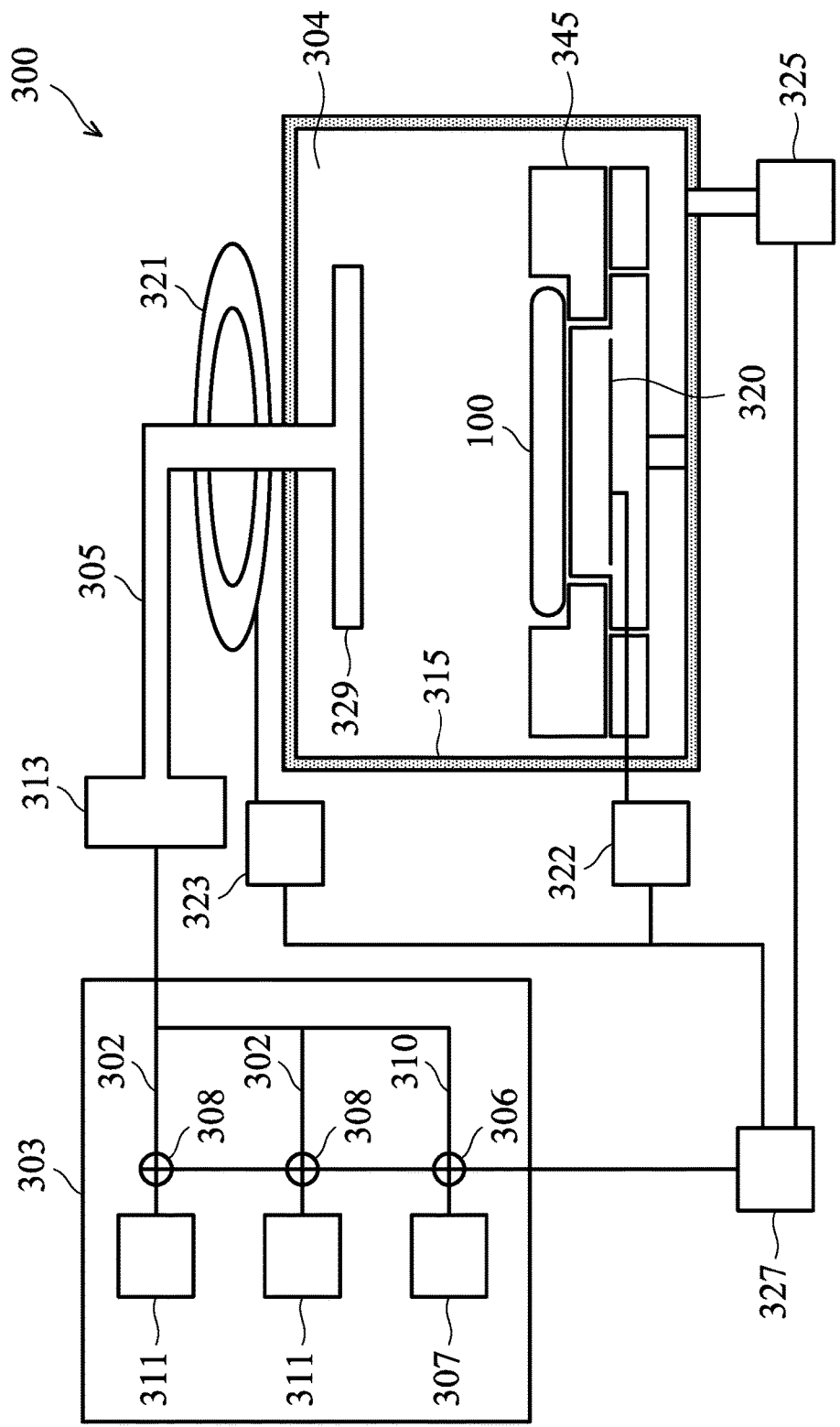
FIGS. 3A-3B illustrate an etching tool and an etching process in accordance with some embodiment.
Figure 3B:
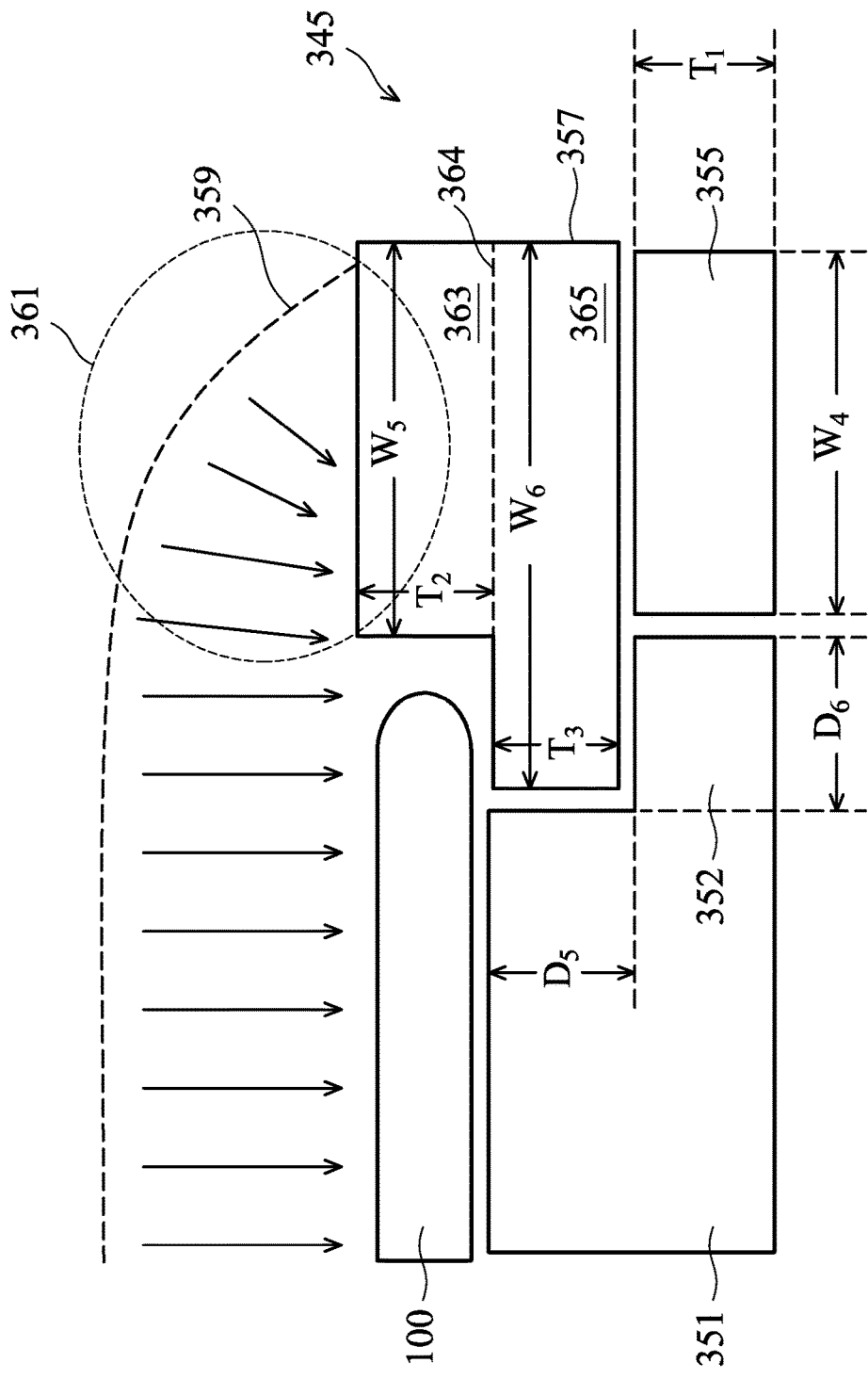

FIGS. 3A-3B illustrate a start of a process to pattern the substrate 101 through the first photoresist 205 in order to form gate stacks 415 by placing the semiconductor wafer 100 (along with the gate electrode material 111, the gate dielectric material 109, the first hardmask 201 and the second hardmask 203) into an etching system 300 such as the one illustrated in FIG. 3A. In an embodiment the etching system 300 may comprise an etchant delivery system 303 that may deliver one or more gaseous etchants to an etching chamber 304. The etchant delivery system 303 supplies the various desired etchants to the etching chamber 304 through an etchant controller 313 and a manifold 305. The etchant delivery system 303 may also help to control the flow rate of the etchant or etchants into the etching chamber 304 by controlling the flow and pressure of a carrier gas through the etchant delivery system 303.

In an embodiment the etchant delivery system 303 may include a plurality of etchant suppliers 311 along with a carrier gas supply 307. Additionally, while only two etchant suppliers 311 are illustrated in FIG. 3A, this is done merely for clarity, as any suitable number of etchant suppliers 311, such as one etchant supplier 311 for each etchant desired to be used within the etching system 300. For example, in an embodiment in which five separate etchants will be utilized, there may be five separate etchant suppliers 311.

Each of the individual etchant suppliers 311 may be a vessel, such as a gas storage tank, that is located either locally to the etching chamber 304 or remotely from the etching chamber 304. In another embodiment, the etchant supplier 311 may be a facility that independently prepares and delivers the desired etchants. Any suitable source for the desired etchants may be utilized as the etchant supplier 311, and all such sources are fully intended to be included within the scope of the embodiments.

In an embodiment the individual etchant suppliers 311 supply an etchant to the etchant controller 313 through first lines 302 with first valves 308. The first valves 308 are controlled by a controller 327 that controls and regulates the introduction of the various etchants and carrier gases to the etching chamber 304.

A carrier gas supply 307 may supply a desired carrier gas, or diluent gas, that may be used to help push or "carry" the various desired etchants to the etching chamber 304. The carrier gas may be an inert gas or other gas that does not react with the etchant itself or with by-products from the etchant's reactions. For example, the carrier gas may be nitrogen ($N_2$), helium (He), argon (Ar), combinations of these, or the like, although other suitable carrier gases may be utilized.

The carrier gas supply 307, or diluent supply, may be a vessel, such as a gas storage tank, that is located either locally to the etching chamber 304 or remotely from the etching chamber 304. In another embodiment, the carrier gas supply 307 may be a facility that independently prepares and delivers the carrier gas to the etchant controller 313. Any suitable source for the carrier gas may be utilized as the carrier gas supply 307, and all such sources are fully intended to be included within the scope of the embodiments. The carrier gas supply 307 may supply the desired carrier gas to the etchant controller 313 through a second line 310 with a second valve 306 that connects the carrier gas supply 307 to the first lines 302. The second valve 306 is also controlled by the controller 327 that controls and regulates the introduction of the various etchants and carrier gases to the etching chamber 304. Once combined, the lines may be directed towards the etchant controller 313 for a controlled entry into the etching chamber 304.

The etching chamber 304 may be any desired shape that may be suitable for dispersing the etchant and contacting the etchant with the substrate 101. In the embodiment illustrated in FIG. 3A, the etching chamber 304 has a cylindrical sidewall and a bottom. However, the etching chamber 304 is not limited to a cylindrical shape, and any other suitable shape, such as a hollow square tube, an octagonal shape, or the like, may be utilized. Furthermore, the etching chamber 304 may be surrounded by an etchant chamber housing 315 made of material that is inert to the various process materials. As such, while the etchant chamber housing 315 may be any suitable material that can withstand the chemistries and pressures involved in the etching process, in an embodiment the etchant chamber housing 315 may be steel, stainless steel, nickel, aluminum, alloys of these, combinations of these, and the like.

Additionally, the etching chamber 304 and the mounting platform 345 may be part of a cluster tool system (not shown). The cluster tool system may be used in conjunction with an automated handling system in order to position and place the substrate 101 into the etching chamber 304 prior to the etching process, position and hold the substrate 101 during the etching processes, and remove the substrate 101 from the etching chamber 304 after the etching processes.

Within the etching chamber 304 is located a mounting platform 345 in order to position and control the substrate 101 during the etching process. The mounting platform 345 may hold the substrate 101 using electrostatic forces, clamps, vacuum pressure, combinations of these, or the like, and may also include heating and cooling mechanisms in order to control the temperature of the substrate 101 during the processes.

Additionally, the mounting platform 345 may comprise a first electrode 320 coupled to a first RF generator 322. The first electrode 320 may be electrically biased by the first RF generator 322 (under control of the controller 327) at a RF voltage during the etching process. By being electrically biased, the first electrode 320 is used to provide a bias to the incoming etchants and assist to ignite them into a plasma. Additionally, the first electrode 320 is also utilized to maintain the plasma during the etching process by maintaining the bias and also to help accelerate ions from the plasma towards the semiconductor wafer 100.

FIG. 3B illustrates a close-up view of a portion of the mounting platform, with a portion of the joint between the substrate 101 and the mounting platform 345 being illustrated. As can be seen, the mounting platform 345 in this view may comprise a number of different components to help hold and secure the substrate 101 before, during, and after the etching process. In a particular embodiment the mounting platform has a first chuck 351, a first base ring 355, and a first edge ring 357.

In an embodiment the first chuck 351 is an electrostatic chuck that uses the first electrode 320 to not only generate and maintain the plasma during the etching process, but also uses the electrostatic forces generated by the first electrode 320 to hold and support the semiconductor wafer 100 attached to the mounting platform 345. As such, the first electrode 320 is incorporated into the first chuck 351. However, any suitable combination of chuck, such as clamping chucks or vacuum chucks, and first electrode 320 may be utilized.

In an embodiment the first chuck 351 has a chuck edge portion 352 (represented in FIG. 3B by the dashed line) that helps to allow for placement of the first edge ring 357. In an embodiment the edge portion extends inwards in order to allow for alignment with the first edge ring 357. As such, while the precise dimensions of the edge portion depend at least in part upon the dimensions and shape of the first edge ring 357 (described further below), in an embodiment the edge portion may extend downwards from an attachment surface of the first chuck 351 a fifth distance $D_5$ of between about 12 mm and about 15 mm, and may also extend inwards from an exterior edge of the first chuck 351 a sixth distance $D_6$ of between about 10 mm and about 12 mm. However, any suitable distances may be utilized.

The first base ring 355 is placed adjacent to the first chuck 351 and is used to help support the first edge ring 357. In an embodiment the first base ring 355 may be made of a material such as quartz, although any other suitable material, such as silicon carbide or a ceramic, may also be used. In an embodiment the first base ring 355 may have a first thickness $T_1$ of about 36 mm, and may have a fourth width $W_4$ of between about 14 mm and about 15 mm. However, any suitable dimensions may be utilized.

The first edge ring 357 is located over the first base ring 355 and helps to provide a fine positioning for the substrate 101 over the first chuck 351 while also containing the substrate 101 from moving off of the first chuck 351 prior to an attachment of the substrate 101 to the first chuck 351 (e.g., before application of the electrostatic forces when the first chuck 351 is an electrostatic chuck). In addition, the first edge ring 357 also works to help shield the first chuck 351 from damage during the etching process. As such, in an embodiment the first edge ring 357 is placed over the first base ring 355 and is also placed over the chuck edge portion 352 of the first chuck 351, such that no portion of the top surface of the first chuck 351 is directly exposed to plasma during the etching process.

In an embodiment the first edge ring 357 may be shaped in order to help position the substrate 101. In a particular example, the first edge ring 357 may have two sections such as a vertical support section 365 and a horizontal support section 363 (shown as being separated from each other in FIG. 3B by dashed line labeled 364). In an embodiment the horizontal support section 363 may have a fifth width $W_5$ of between about 24 mm and about 25 mm, and may have a second thickness $T_2$ greater than the thickness of the semiconductor wafer 100 of between about 2 mm and about 5 mm. Additionally, the vertical support section 365 may have a sixth width $W_6$ of between about 26 mm and about 27 mm, and may have a third thickness $T_3$ of between about 0.3 mm and about 0.7 mm. Combined, the second thickness $T_2$ and the third thickness $T_3$ may have a combined thickness of between about 2.3 mm and about 5.7 mm. However, any suitable dimensions may be used.

The first edge ring 357 may be made of a material that can extend the electric field generated by the first electrode 320 during the etching process, and may be electrically isolated from the first electrode 320. For example, in one embodiment the first edge ring 357 may be made of a high electron mobility material such as silicon doped with nitrogen (silicon nitride), silicon doped with carbon (silicon carbide), silicon doped with fluorine (silicon fluoride), silicon doped with oxygen (silicon oxide), combinations of these, or the like. By forming the first edge ring 357 out of materials with a high electron mobility (rather than materials will low electron mobility such as quartz or diamond-zincblende structures), the electric field generated by the etching chamber 304 will be extended further out over the first edge ring 357, as described further below.

In an embodiment in which the high electron mobility material is silicon doped with nitrogen, the nitrogen may have an atomic concentration of between about 55% and about 65%, such as about 60%. In an embodiment in which the high electron mobility material is silicon doped with carbon, the carbon may have an atomic concentration of between about 45% and about 55%, such as about 50%. In an embodiment in which the high electron mobility material is silicon doped with fluorine, the fluorine may have an atomic concentration of between about 70% and about 80%, such as about 75%. Finally, in an embodiment in which the high electron mobility material is silicon doped with oxygen, the oxygen may have an atomic concentration of between about 55% and about 65%, such as about 60%. However, any suitable concentration of dopants may be utilized.

Returning now to FIG. 3A, in some embodiments the etching chamber 304 comprises a showerhead 329. In an embodiment the showerhead 329 receives the various etchants from the manifold 305 and helps to disperse the various etchants into the etching chamber 304. The showerhead 329 may be designed to evenly disperse the etchants in order to minimize undesired process conditions that may arise from uneven dispersal. In an embodiment the showerhead 329 may have a circular design with openings dispersed evenly around the showerhead 329 to allow for the dispersal of the desired etchants into the etching chamber 304. However, any suitable method of introducing the desired etchants, such as entry ports, may be utilized to introduce the desired etchants into the etching chamber 304.

The etching chamber 304 also comprises an upper electrode 321, for use as a plasma generator. In an embodiment the plasma generator may be a transformer coupled plasma generator and may be, e.g., a coil. The coil may be attached to a second RF generator 323 that is utilized to provide power to the upper electrode 321 (under control of the controller 327) in order to ignite the plasma during introduction of the reactive etchants.

However, while the upper electrode 321 is described above as a transformer coupled plasma generator, embodiments are not intended to be limited to a transformer coupled plasma generator. Rather, any suitable method of generating the plasma, such as inductively coupled plasma systems, magnetically enhanced reactive ion etching, electron cyclotron resonance, a remote plasma generator, or the like, may be utilized. All such methods are fully intended to be included within the scope of the embodiments.

The etching chamber 304 may also be connected to a vacuum pump 325. In an embodiment the vacuum pump 325 is under the control of the controller 327, and may be utilized to control the pressure within the etching chamber 304 to a desired pressure. Additionally, once the etching process is completed, the vacuum pump 325 may be utilized to evacuate the etching chamber 304 in preparation for removal of the semiconductor wafer 100.

Additionally, while a number of particular parts of the etching system 300 have been described above, other suitable parts may also be included. For example, endpoint mounts, liners, and any other parts that may help operate or control the etching process may also be included. All such parts are fully intended to be included within the scope of the embodiments.

With reference now to both FIG. 3A and FIG. 3B, to begin to pattern the gate electrode material 111 and the gate dielectric material 109, the process may be started by placing the substrate 101 onto the mounting platform 345, wherein the placement of the substrate 101 is guided at least in part through the use of the first edge ring 357 in order to align the substrate 101 with the first chuck 351. Once the substrate 101 has been placed onto the first chuck 351, the substrate may be attached to the first chuck 351 using an attachment process. In an embodiment in which the first chuck 351 is an electrostatic chuck, the substrate 101 may be attached to the first chuck 351 by applying a current to the first electrode 320 such that electrostatic forces will apply a force to hold the substrate 101 to the attachment surface of the first chuck 351.

Once the substrate 101 has been placed and is attached to the first chuck 351, the controller 327 may initiate the etching process by connecting one or more of the etchant suppliers 311 and another one of the carrier gas suppliers 307 to the etching chamber 304 to introduce a first etching combination of etchants. While the precise etchants utilized are dependent at least in part upon the materials chosen for the gate dielectric material 109, the gate electrode material 111, the first hardmask 201, and the second hardmask 203, in an embodiment the first etching combination of etchants may comprise a combination of hydrogen chloride (HCl) and oxygen ($O_2$) along with a second diluent such as nitrogen ($N_2$). In an embodiment the oxygen is introduced at a rate of between about 2 sccm and about 10 sccm, such as about 5 sccm, and the nitrogen is introduced at a rate of between about 5 sccm and about 25 sccm, such as about 15 sccm, and the hydrogen chloride is introduced as a rate of between about 5 sccm and about 15 sccm, such as about 10 sccm. However, any suitable etchant or combination of etchants and diluents may be utilized.

Within the etching chamber 304, the first etching combination of etchants may be ignited into a plasma for a reactive ion etch process. In an embodiment the first etching combination of etchants may be ignited by the controller 327 sending a signal to the second RF generator 323 to supply to the upper electrode 321 a power of between about 150 W and about 550 W, such as about 350 W. The controller 327 may also send a signal to the first RF generator 322 in order to supply a bias to the first electrode 320 within the first chuck 351. In an embodiment the first RF generator 322 supplies a bias of between about 60 V and about 180 V, such as about 130 V.

By using the first RF generator 322 to supply the bias to the first electrode 320 within the first chuck 351, an electric field and a sheath (represented in FIG. 3B by the dashed line labeled 359) will be created over the surface of the semiconductor wafer 100 facing away from the first chuck 351. The electric field and sheath 359 will help move and accelerate ions from the plasma towards the surface to be etched (e.g., the second hardmask 203, the first hardmask 201, the gate electrode material 111, and the gate dielectric material 109).

However, as can be seen, the electric field and the sheath 359 are not planar. In particular, at an edge region (represented in FIG. 3B by the dashed circle labeled 361) of the sheath 359 the sheath 359 will curve downwards, resulting in a non-planar curvature within the edge region 361 of the sheath 359. When ions from the plasma enter this edge region 361 of the sheath 359, the sheath 359 will still accelerate the ions, but will not accelerate them at an angle that is perpendicular to the substrate 101. Rather, the ions will be accelerated at an angle that is not perpendicular to the substrate 101.

If the first edge ring 357 is not adjusted to account for this curvature of the sheath 359, and is made from a material such as quartz or diamond-zincblende structure, the curvature will have deleterious effects on the etching process. For example, if the ions from the plasma were to impact the layers over the substrate 101 (e.g., the second hardmask 203, the first hardmask 201, the gate electrode material 111, and the gate dielectric material 109), the non-perpendicular impact will result in a pattern that is angled with respect to the substrate 101 instead of the desired perpendicular pattern transfer. Further, not only will there be a non-perpendicular transfer of the pattern, but this non-perpendicular transfer will only occur within the edge region 102 of the semiconductor wafer 100. In particular, within the central region 104 of the semiconductor wafer 100, the sheath 359 will have a relatively planar shape, allowing the ions that enter the sheath 359 at this location to be accelerated perpendicularly towards the substrate 101. As such, between the perpendicular acceleration in the central region 104 and the non-perpendicular acceleration in the edge region 102 of the semiconductor wafer 100, there will be a non-uniform effect across the semiconductor wafer 100 depending on the distance from the edge region 361 of the sheath 359.

However, by forming the first edge ring 357 as described above, the sheath 359 may be prevented from ending near the edge of the substrate 101 and may be extended outward to end near an outer edge of the first edge ring 357, the outer edge facing away from the semiconductor wafer 100. By moving the edge region 361 of the sheath 359 outwards, the curvature of the edge region 361 of the sheath 359 is also moved outwards and is located almost entirely, if not completely, over the first edge ring 357. As such, any of the ions that enter the edge region 361 of the sheath 359 and are accelerated at a non-perpendicular angle will not impact the layers to be etched (e.g., the second hardmask 203, the first hardmask 201, the gate electrode material 111, and the gate dielectric material 109), but will instead impact the surface of the first edge ring 357 and not harming the semiconductor wafer 100.

Additionally, by extending the sheath 359 such that the edge region 361 is located over the first edge ring 357, the planar region of the sheath 359 will also be extended such that the planar region covers the edge region 102 of the semiconductor wafer 100. As such, instead of ions being accelerated towards the edge region 102 at a non-perpendicular angle, the ions accelerated towards the edge region 102 will be directed closer to a perpendicular angle with the substrate 101. As such, a more perpendicular transfer of the desired pattern will occur, and a more uniform patterning process across the semiconductor wafer 100 may be obtained.

Once the plasma has been ignited and the ions are being directed towards the semiconductor wafer, the process conditions as described above are maintained in order to expose the second hardmask 203 to the plasma generated within the etching chamber 304 and remove exposed portions of the second hardmask 203. Once the pattern of the first photoresist 205 has been transferred to the second hardmask 203, the etching process may be continued to transfer the pattern to the first hardmask 201. In an embodiment in which the first etching combination of etchants will etch the first hardmask 201 as well as the second hardmask 203, the etching process may simply be continued without changing the first etching combination of etchants. In another embodiment, if desired, the first etching combination of etchants may be changed by the controller 327 connecting another one of the one or more of the etchant suppliers 311 and another one of the carrier gas suppliers 307 to the etching chamber 304 to introduce a second etching combination of etchants. However, any suitable method may be utilized.

Similarly, once the pattern of the second hardmask 205 has been transferred to the first hardmask 201, the etching process may be continued to transfer the pattern to the underlying gate electrode material 111 and form gate electrodes 401. In an embodiment in which the first etching combination of etchants will etch the gate electrode material 111 as well as the first hardmask 201 and the second hardmask 203, the etching process may simply be continued without changing the first etching combination of etchants. In another embodiment, if desired, the first etching combination of etchants (or second etching combination of etchants if the second etching combination of etchants has been used), may be changed by the controller 327 connecting another one of the one or more of the etchants suppliers 311 and another one of the carrier gas suppliers 307 to the etching chamber 304 to introduce a third etching combination of etchants. However, any suitable method may be utilized.

Finally, once the pattern of the first hardmask 201 has been transferred to the gate electrode material 111 to form the gate electrodes 401, the etching process may be continued to transfer the pattern to the gate dielectric material 109 in order to form gate dielectrics 403 and gate stacks 415 (from the gate dielectrics 403 and the gate electrodes 401). In an embodiment in which the first etching combination of etchants will etch the gate dielectric material 109 as well as the gate electrode material 111, the first hardmask 201, and the second hardmask 203, the etching process may simply be continued without changing the first etching combination of etchants. In another embodiment, if desired, the first etching combination of etchants (or second etching combination of etchants or third etching combination of etchants if the second etching combination of etchants or the third etching combination of etchants has been used), may be changed by the controller 327 connecting another one of the one or more of the etchants suppliers 311 and another one of the carrier gas suppliers 307 to the etching chamber 304 to introduce a fourth etching combination of etchants. However, any suitable combination of etchants may be utilized.

At this point, if desired, the first photoresist 205 may be removed. In an embodiment the first photoresist 205 may be removed through a thermal process such as ashing, whereby the temperature of the first photoresist 205 is increased until the first photoresist 205 suffers a thermal breakdown and may be removed. However, any suitable removal process, such as a wet or dry etching process, may be used to remove the first photoresist 205.

By utilizing the etching process as described above along with the first edge ring 357, the ion flux of the ions utilized during the etching process may be extended beyond the substrate 101. As such, crowding of the ion flux that occurs near the edges of the semiconductor wafer 100 may be moved to a point that is over the first edge ring 357 and not over the substrate 101. As such, the ion flux will have less crowding over the semiconductor wafer 100, allowing for a more even flux and less variation in the gate electrodes 401 adjacent to the edge region 102 of the semiconductor wafer 100 that is induced by the uneven ion flux.

Figure 4A:
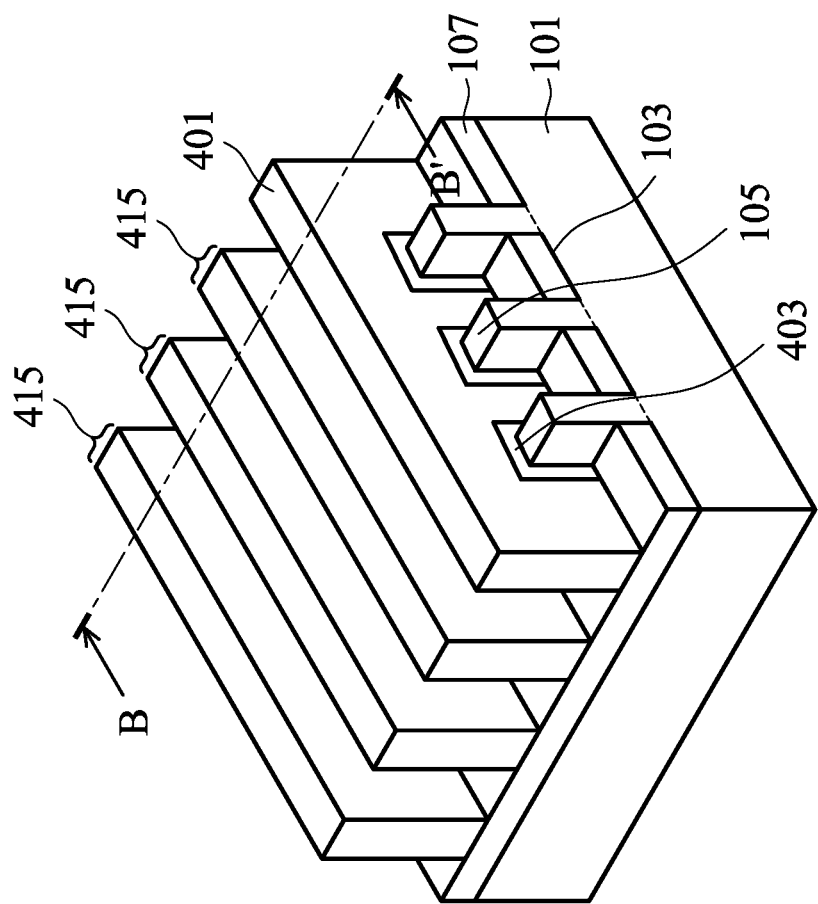
FIGS. 4A-4B illustrate a formation of a gate electrode in accordance with some embodiments.
Figure 4B:
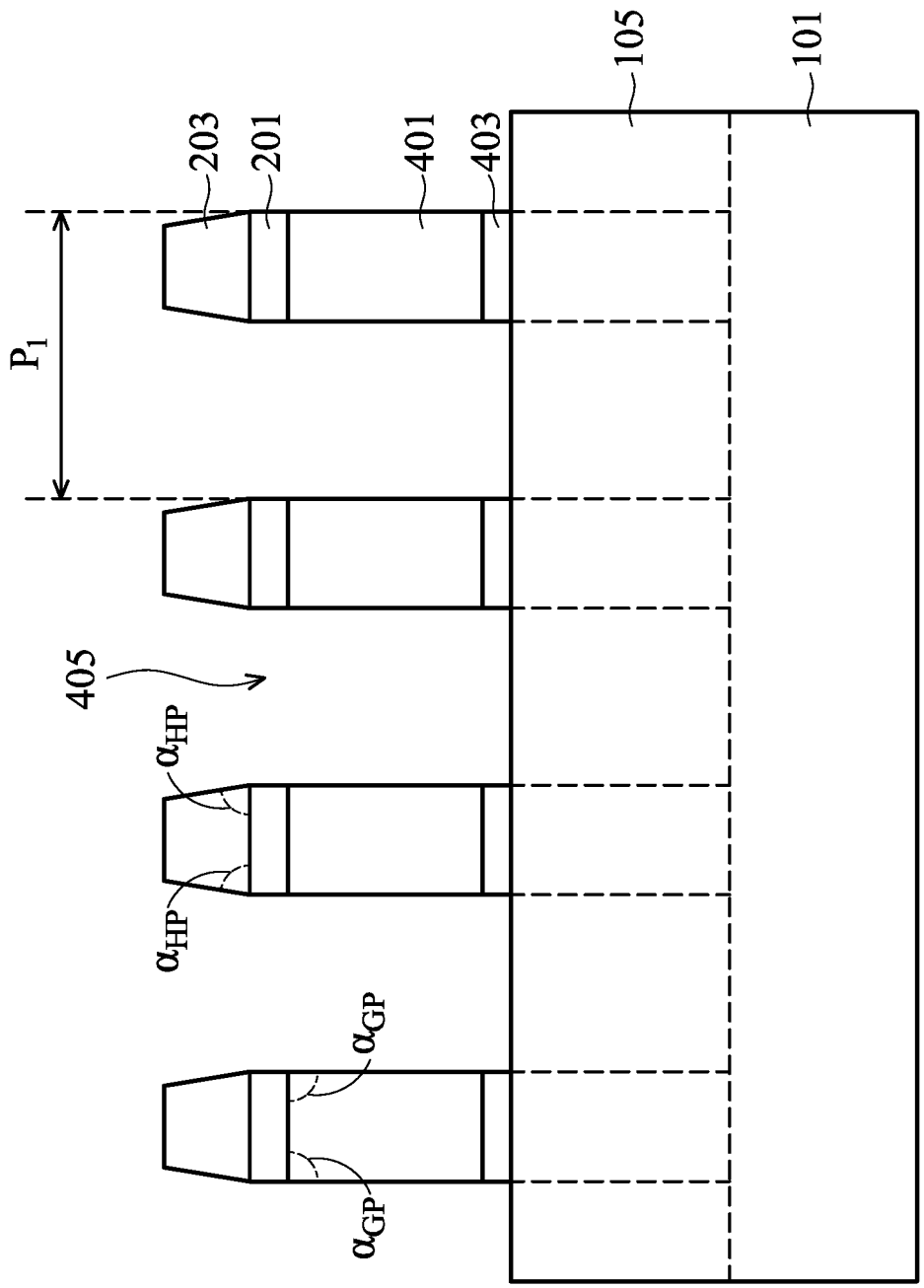

FIGS. 4A-4B illustrate an embodiment in which the etching process described above with respect to FIGS. 3A-3B is utilized to form four gate electrodes 401 over the fins 105, with FIG. 4B being a cross-sectional view of FIG. 4A along line B-B'. For example, in an embodiment in which the first edge ring 357 is utilized as described above, the gate electrodes 401 may have a first pitch $P_1$ of between about 65 nm and about 68 nm, such as about 66 nm. Additionally, openings 405 between the gate electrodes 401 formed by the etching process may also have an aspect ratio of larger than about 3.5 or 4.0, such as about larger than 3.64.

In addition to simply the first pitch $P_1$ and the aspect ratio of the openings 405, the gate electrodes 401 themselves will also have a more uniform fin profile. For example, in an embodiment in which the gate electrodes 401 may have a bottom critical dimension (BCD), such as a critical dimension less than 10% up the height of the gate electrodes 401, that is considered to have a unit profile of between about 0.95 and about 1.05, such as about 1, a middle critical dimension (MCD), such as a critical dimension between about 10% and about 50% up the height of the gate electrodes 401, may be between about 90% and about 110% of the bottom critical dimension, such as about 100%. Additionally, the gate electrodes 401 may also have a top critical dimension (TCD), such as a critical dimension between about 50% and about 90% up the height of the gate electrodes 401, of between about 80% and about 110% of the bottom critical dimension, such as about 95%. However, any suitable dimensions may be utilized.

Additionally, once the etching process has been performed, the second hardmask 203 (e.g., the oxide hardmask), may have a hardmask profile angle $\alpha_{HP}$ and the gate electrode 301 may have a gate profile angle $\alpha_{GP}$. In an embodiment the hardmask profile angle $\alpha_{HP}$ may be between about 73° and about 77°, and may be seen on opposing sides of the second hardmask 203. The gate profile angle $\alpha_{GP}$ may be between about 88° and about 90° and may also be seen on both sides of the gate electrode 401. However, any suitable dimensions may be utilized.

However, while the etching tools and processes have been described above with respect to an etching of a gate electrode and gate dielectric, these descriptions of this embodiment are not intended to limit the embodiments to this description. Rather, the processes described above could be applied to any suitable etching process. For example, the etching process may be performed with respect to a process to etch the fins 105. Any suitable etching process may utilize the above description, and all such processes are fully intended to be included within the scope of the embodiments.

Figure 5:
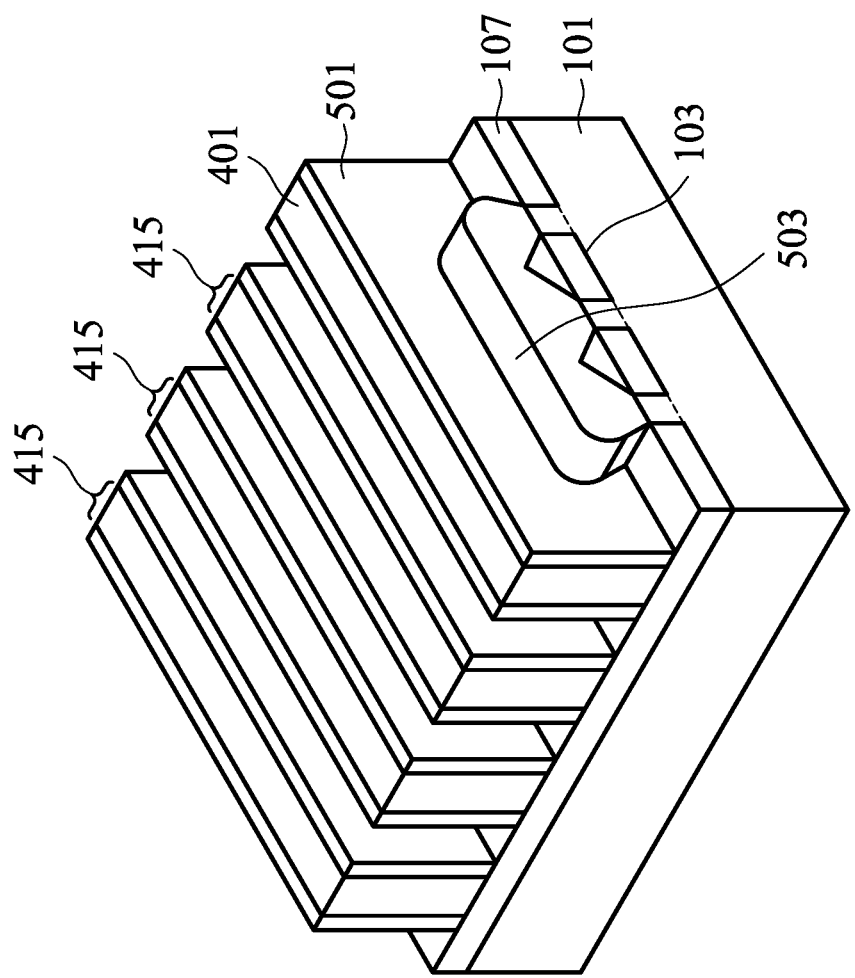
FIG. 5 illustrates a formation of a source/drain region after the formation of the gate electrodes in accordance with some embodiments.

FIG. 5 illustrates that, once the gate stacks 415 have been patterned, the first hardmask 201 and the second hardmask 203 may be removed, first spacers 501 may be formed, and the fins 105 may have a portion that is uncovered by the gate stacks 415 and the first spacers 501 removed. In an embodiment the first hardmask 201 and the second hardmask 203 are removed using an etching process such as a wet etch or a dry etch. However, any suitable removal process may be used.

The first spacers 501 may be formed on opposing sides of the gate stacks 415. The first spacers 501 are typically formed by blanket depositing a spacer layer (not separately illustrated in FIG. 5) on the previously formed structure. The spacer layer may comprise SiN, oxynitride, SiC, SiON, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 107. The first spacers 501 may then be patterned, such as by one or more etches to remove the spacer layer from the horizontal surfaces of the structure, to form the first spacers 501.

FIG. 5 also illustrates a removal of the fins 105 from those areas not protected by the gate stacks 415 and the first spacers 501. This removal may be performed by a reactive ion etch (RIE) using the gate stacks 415 and the first spacers 501 as masks, or by any other suitable removal process. The removal may be continued until the fins 105 are either planar with or below the surface of the first isolation regions 107.

Once the fins 105 have been removed from those areas not protected by the gate stacks 415, source/drain regions 503 may be regrown from the exposed portions of the substrate 101 and in contact with each of the fins 105. In an embodiment the source/drain regions 503 may be regrown to form a stressor that will impart a stress to the channel regions of the fins 105 located underneath the gate stacks 415. In an embodiment wherein the fins 105 comprise silicon and the FinFET is a p-type device, the source/drain region 503 may be regrown through a selective epitaxial process with a material, such as silicon germanium that has a different lattice constant than the fins 105. The epitaxial growth process may use precursors such as silane, dichlorosilane, germane, and the like, and may continue for between about 5 minutes and about 120 minutes, such as about 30 minutes. The source/drain regions 503 may be formed to have a height above the upper surface of the first isolation region 107 of between about 5 nm and about 250 nm, such as about 100 nm.

Figure 6:
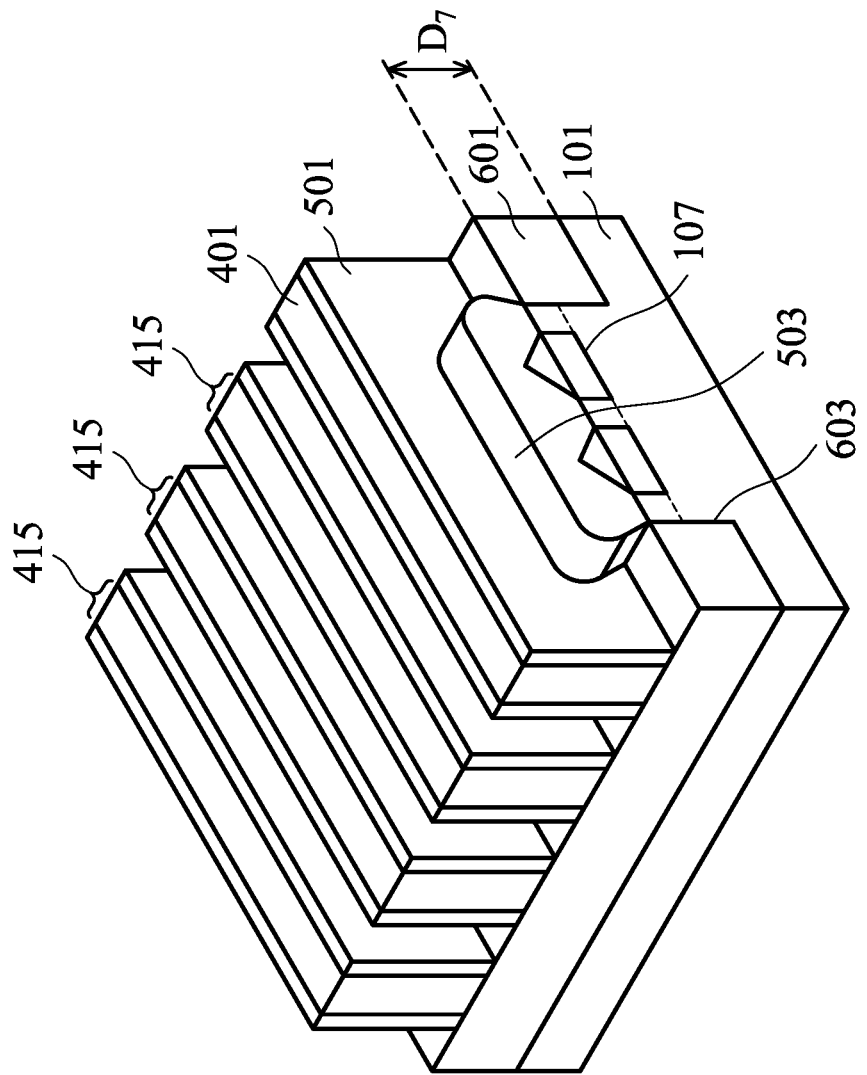
FIG. 6 illustrates another embodiment which uses multiple isolation regions in accordance with some embodiments.

FIG. 6 illustrates another embodiment in which the first isolation regions 107 are used to isolate the fins 105 from each other, and second isolation regions 601 are used to isolate the fins 105 from other sections of the substrate 101 such as separate groupings of fins 105 (not separately illustrated). In this embodiment the second isolation regions 601 may be formed by initially forming second trenches 603. The second trenches 603 may be formed prior to, after, or even partially along with the first trenches 103, such as by using a photolithographic masking and etching process similar to the process described above with respect to the formation of the first trenches 103. For example, in one embodiment openings for the second trenches 603 may be initially made within the substrate 101 with a first masking and etching process and then these openings may be extended at the same time that the first trenches 103 are formed with a second masking and etching process. However, the second trenches 603 may be formed to extend a seventh distance $D_7$ from the top of the substrate 101 and the fins 105 that is deeper than the third distance $D_3$ of the first trenches 103. In a particular embodiment the first trenches 103 may be formed to have the third distance $D_3$ of between about 40 Å and about 500 Å, such as about 42 Å, and the second trenches 603 may be formed such that the seventh distance $D_7$ is between about 200 Å and about 7,000 Å, such as being between about 32 nm and about 36 nm, or being about 3,190 Å. However, any suitable depths may be utilized.

Once the second trenches 603 have been formed along with the first trenches 103, the first trenches 103 and the second trenches 603 may be filled with the dielectric material to form the first isolation regions 107 and the second isolation region 601. In an embodiment the first trenches 103 and the second trenches 603 may be filled as described above with respect to FIG. 1. For example, the dielectric material may be deposited such that the dielectric material fills the first trenches 103 and the second trenches 603, and then the dielectric material may be recessed to expose the top surfaces of the fins 105 and form the first isolation regions 107 and the second isolation regions 601. Once the first isolation regions 107 and the second isolation regions 601 have been formed, processing may continue as described above to form the gate stacks 415 and the source/drain regions 503.

By utilizing the second isolation regions 601 along with the first isolation regions 107, a better tuning of the isolation may be obtained. For example, the first isolation regions 107 may be tuned to the specific desires of intra-fin isolation (between fins 105 covered by a same gate stack 415), while the second isolation regions 601 may be tuned to the specific desires of inter-fin isolation (between fins 105 covered by separated gate stacks, not separately illustrated). Such ability to tune the isolation regions allows for greater process variability.

By using the tools and processes described herein, a more uniform etching profile along the wafer edge may be achieved by tailoring the electric field through the electric conductivity of a tunable doping edge ring. The electric field can be controlled and adjusted by utilizing different materials of electric conductivity to fit the desired etching profile. Such a tuning helps to overcome the inability of other process factors, such as transformer-coupled capacitive tuning (TCCT) parameter, the electrostatic chuck multi-zone temperature parameters, and gas position parameters (e.g., center, edge, equal) to achieve a more uniform process to achieve the desired critical dimensions and profiles. Additionally, the above described process will help to reduce or eliminate problems related to uniformity mismatch either within the wafer or else between chambers.

In accordance with an embodiment, a method of manufacturing a semiconductor device comprising providing a first chuck, the first chuck comprising a first electrode to generate a sheath over the first chuck is provided. The sheath is extended by placing a first edge ring adjacent to the first chuck, wherein the first edge ring is formed of a high electron mobility material and is electrically isolated from the first chuck.

In accordance with another embodiment, a method of manufacturing a semiconductor device comprising placing a first edge ring adjacent to a first electrostatic chuck and attaching a semiconductor wafer onto the first electrostatic chuck is provided. A sheath is generated over the semiconductor wafer, the sheath comprising a first region and a second region, wherein ions that enter the first region of the sheath are accelerated at an angle perpendicular to the semiconductor wafer and wherein ions that enter the second region of the sheath are accelerated at an angle that is not perpendicular to the semiconductor wafer, wherein the ions that enter the second region impact the first edge ring and do not impact the semiconductor wafer.

In accordance with yet another embodiment, a semiconductor manufacturing tool comprising an electrostatic chuck and a base ring adjacent to the electrostatic chuck is provided. An edge ring extends over both the electrostatic chuck and the base ring and is electrically isolated from the electrostatic chuck, wherein the edge ring comprises silicon doped with nitrogen, silicon doped with carbon, silicon doped with fluorine, or silicon doped with oxygen.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   providing a first chuck, the first chuck comprising a first electrode to generate a sheath over the first chuck;
   extending the sheath by placing a first edge ring adjacent to the first chuck, wherein the first edge ring is formed of a high electron mobility material and is electrically isolated from the first chuck;
   placing a semiconductor substrate within the first edge ring; and
   etching a gate electrode material over semiconductor fins located over the semiconductor substrate to form a gate electrode, wherein the gate electrode after the etching the gate electrode comprises:
   a bottom portion with a bottom critical dimension;
   a middle portion with a middle critical dimension, wherein the middle critical dimension is between about 90% and about 110% of the bottom critical dimension; and
   a top portion with a top critical dimension, wherein the top critical dimension is between 80% and 110% of the bottom critical dimension.

2. The method of claim 1, wherein the high electron mobility material comprises silicon doped with nitrogen, silicon doped with carbon, silicon doped with fluorine, or silicon doped with oxygen.

3. The method of claim 1, further comprising:
   attaching the semiconductor substrate to the first chuck.

4. The method of claim 3, wherein the attaching the semiconductor substrate to the first chuck further comprises applying an electrostatic force to the semiconductor substrate.

5. A method of manufacturing a semiconductor device, the method comprising:
   placing a first edge ring adjacent to a first electrostatic chuck;
   attaching a semiconductor wafer onto the first electrostatic chuck; and
   generating a sheath over the semiconductor wafer, the sheath comprising a first region and a second region, wherein ions that enter the first region of the sheath are accelerated at an angle perpendicular to the semiconductor wafer and wherein ions that enter the second region of the sheath are accelerated at an angle that is not perpendicular to the semiconductor wafer, wherein the ions that enter the second region impact the first edge ring and do not impact the semiconductor wafer, wherein the semiconductor wafer comprises a semiconductor substrate, semiconductor fins over the semiconductor substrate, a gate electrode material over the semiconductor fins, a first hardmask over the gate electrode material, and a second hardmask over the first hardmask.

6. The method of claim 5, wherein after the generating the sheath the second hardmask has a first profile angle along a first sidewall of less than about 75°.

7. The method of claim 6, wherein after the generating the sheath the second hardmask has a second profile angle along a second sidewall of less than about 75°, wherein the second sidewall is opposite the first sidewall.

8. The method of claim 5, wherein after the generating the sheath an opening is formed through the gate electrode material, wherein the opening has an aspect ratio of greater than 3.64%.

9. The method of claim 5, wherein after the generating the sheath a plurality of gate electrodes are formed from the gate electrode material, the gate electrodes having a pitch of about 66 nm.

10. The method of claim 5, wherein after the generating the sheath a plurality of gate electrodes are formed from the gate electrode material, the gate electrode having a gate profile angle of greater than 90°.

11. A method of manufacturing a semiconductor device, the method comprising:

placing a semiconductor wafer into a first tool, the first tool comprising:
an electrostatic chuck;
a base ring adjacent to the electrostatic chuck; and
an edge ring extending over both the electrostatic chuck and the base ring and electrically isolated from the electrostatic chuck, wherein the edge ring comprises silicon doped with nitrogen, silicon doped with carbon, silicon doped with fluorine, or silicon doped with oxygen, and wherein the edge ring comprises a horizontal support section and a vertical support section extending above a portion of the horizontal support section; and generating a sheath over the semiconductor wafer within the first tool, the sheath accelerating ions at a first angle and at a second angle different from the first angle, wherein the first angle directs ions towards the semiconductor wafer and the second angle directs ions towards the edge ring, wherein the semiconductor wafer comprises a semiconductor substrate and semiconductor fins over the semiconductor substrate.

12. The method of claim 11, wherein the vertical support section has a first width and the horizontal support section has a second width larger than the first width.

13. The method of claim 12, wherein the first width is greater than about 24 mm.

14. The method of claim 11, wherein the edge ring comprises silicon doped with nitrogen or silicon doped with oxygen.

15. The method of claim 11, wherein the edge ring comprises silicon doped with fluorine or silicon doped with carbon.

16. The method of claim 1, wherein the first electrode is at least partially within the first chuck, the first electrode and the first chuck are formed of different materials, and at least a portion of the first electrode and at least a portion of the first chuck are on a same side of a semiconductor substrate.

17. The method of claim 1, wherein a bottom surface of the first edge ring is above a topmost surface of a base ring below the first edge ring.

* * * * *